United States Patent [19]

Aizawa

[11] Patent Number: 4,508,457

[45] Date of Patent: Apr. 2, 1985

[54] ELECTRONIC TIMEPIECE WITH RECORD/PLAYBACK CIRCUITS

[75] Inventor: Hitomi Aizawa, Suwa, Japan

[73] Assignee: Kabushiki Kaisha Suwa Seikosha, Japan

[21] Appl. No.: 444,294

[22] Filed: Nov. 24, 1982

[30] Foreign Application Priority Data

Nov. 27, 1981 [JP] Japan ................................ 56-191221
Sep. 8, 1982 [JP] Japan ................................ 57-156099

[51] Int. Cl.³ ........................ G04B 21/08; G11C 13/00

[52] U.S. Cl. ........................................ 368/63; 368/251

[58] Field of Search ........................ 368/10, 63, 72–75, 368/250–251, 272–273; 84/1.01, 1.03; 365/45

[56] References Cited

U.S. PATENT DOCUMENTS

| | | | |
|---|---|---|---|
| 4,090,349 | 5/1978 | Takase | 368/273 |
| 4,245,336 | 1/1981 | Stietenroth | 368/75 |
| 4,267,586 | 5/1981 | Uchino et al. | 368/73 |
| 4,326,276 | 4/1982 | Scott, Jr. | 368/10 |
| 4,368,988 | 1/1983 | Tahara et al. | 368/63 |
| 4,368,989 | 1/1983 | Kawashima | 368/74 |
| 4,406,549 | 9/1983 | Takahashi | 368/63 |

*Primary Examiner*—Vit W. Miska
*Attorney, Agent, or Firm*—Blum, Kaplan, Friedman, Silberman & Beran

[57] ABSTRACT

The electronic timepiece includes coding means to code voice signals inputted from an outside source, a semiconductor memory circuit in which the coded signal is written and stored, a voice synthesizing circuit which reads the coded signals from the memory circuit and converts the coded signals into an analog voice signal, generating means to generate voice using the analog output of the voice synthesizing circuit, and a controller which controls reading and writing of coded signals out of and into the memory circuit. The control signals provided by the controller are of variable period in response to operation of an external member such that data is written into and read out of the memory circuit at selected bit rates.

38 Claims, 3 Drawing Figures

ELECTRONIC TIMEPIECE WITH RECORD/PLAYBACK CIRCUITS

BACKGROUND OF THE INVENTION

This invention relates generally to an electronic timepiece of the type having an audible signal circuit and more particularly, to an electronic timepiece with a record/playback capability. Electronic timepieces have been developed to have a plurality of functions in addition to timekeeping and products actually on the market often include an alarm function. In these products, an alarm time is arbitrarily selected by the user and when the alarm time arrives, the electronic timepiece informs the user that actual time is coincident with the preselected time by means of the sound of a buzzer or by means of a melody in response to fixed frequency signals.

However, the sound of the alarm is limited to a predetermined sound or melody as designed into the timepiece by the manufacturer. With such an electronic timepiece, the owner must use the sound which is incorporated in the timepiece even if the user does not like that particular sound or is ultimately tired of hearing it. Further, it is necessary that the user recognize the sound and recall from his own memory what is the intended meaning of the sound. This is made more complex in electronic timepieces which use sounds for more than one purpose, for example, an alarm sound as distinguished from an hour-marker sound.

What is needed is an electronic timepiece which provides audible sounds which are readily comprehended as to their purpose by the user and are pleasing to the user.

SUMMARY OF THE INVENTION

Generally speaking, in accordance with the invention, an electronic timepiece especially suitable for providing audible sounds, comprehensible and pleasing to the user is, provided. In the electronic timepiece a message is reproduced with voice so that the user can easily understand from the voice message what the signal means. The reproduced voice can be that of the user, conveying a message of the user's choice, or other sounds can be used, for example, music.

With conventional techniques of synthesizing voice, it is not possible to recognize the reproduced message unless sufficient tone quality is secured. In the electronic timepiece of this invention, the message is highly recognizable to the user when heard, because the voice is that of the user. Therefore, these electronic timepieces can be operated on a lower tone quality with satisfactory results. This is accomplished by reducing the bit rate, that is, the amount of memory capacity which is utilized per second of output speech. By using a lowered bit rate, the recording time is lengthened despite a small capacity in the memory circuit. However, in situations where the audible output must be of good tone quality, it is necessary that a higher bit rate be used in reproducing the sound and the message is shorter for a given memory capacity.

The electronic timepiece in accordance with the invention includes coding means to code voice signals inputted from an outside source, a semi-conductor memory circuit in which the coded signal is written and stored, a voice synthesizing circuit which reads the coded signals from the memory circuit and converts the coded signals into an analog voice signal, generating means to generate voice using the analog output of the voice synthesizing circuit, and a controller which controls the reading of coded signals out of the memory circuit and the writing of coded signals into the memory circuit. The control signals provided by the controller are of variable period in response to operation of an external member on the timepiece such that data is read into and read out of the memory circuit at selected bit rates.

Accordingly, it is an object of this invention to provide an improved electronic timepiece having an audible output circuit which provides comprehendible and pleasing output signals.

Another object of this invention is to provide an improved electronic timepiece including a recording and playback capability for providing audible sounds.

A further object of this invention is to provide an electronic timepiece having a recording and playback capability for audible sounds at varying tone qualities.

Still another object of this invention is to provide an improved electronic timepiece having recording/-playback capabilities for audible sounds, including a memory whose capacity is extended by means of a variable bit rate in reading and writing of said memory.

Yet another object of this invention is to provide an improved electronic timepiece having recording/-playback capabilities for audible sounds, including a semi-conductor memory whose capacity is extended by means of a variable bit rate in reading and writing of said memory.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
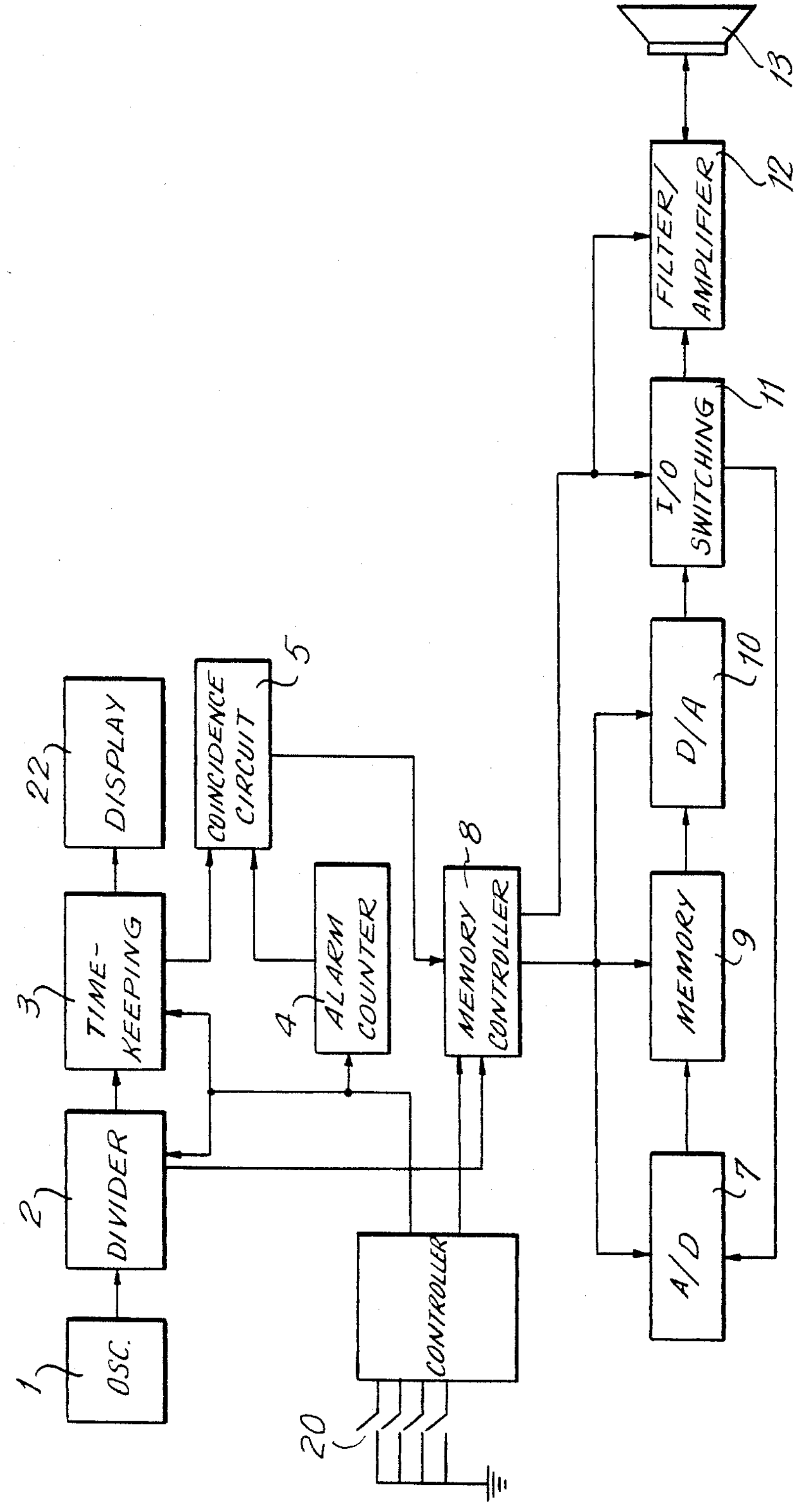
FIG. 1 is a functional block diagram of the electronic circuits for a timepiece with recording/playback capability in accordance with the invention.

With reference to the drawings, FIG. 1 is a functional block diagram of the electronic circuits of an electronic timepiece with record/playback capability in accordance with this invention. An oscillator 1 delivers time standard signals having a relatively high frequency. The high frequency time standard signals are divided in a divider network 2 and time signals are accumulated in a time counter group 3 including counters, for example, for seconds, minutes and hours for visible indication on a display 22. An alarm counter 4 is preset by signals from a switching controller 6, these signals being provided by operating an external operation member by which switches 20 are manipulated in a known manner.

The alarm counter 4 is fixed to a preselected time by the user and when the time counter group 3, representing actual time, coincides with the selected time in the alarm counter group 4, a coincidence detector 5 delivers a coincidence signal at its output. The functional elements 1–6, 20, 22 as described are not a novel portion of the invention, and accordingly, are not given detailed description herein.

The coincidence signal from the coincidence detector 5 starts operation of a memory controller 8, which reads out voice signals from a semi-conductor memory circuit 9. The voice signals are in coded format and have been previously stored in addresses of the semi-conductor memory circuit 9. The addresses are read out in sequence in response to output signals from the divider network 2. The stored signals read out from the memory circuit 9 are digital signals which are converted into analog signals in a digital-to-analog converter 10. These analog signals pass through an input/output switching circuit 11, and an amplifier and filter circuit 12. The voice is then reproduced by means of a speaker 13.

The memory controller 8 can also be started on demand by a switching operation of the user using the switches 20 and the controller 6 in order to reproduce sounds from the memory in the same manner.

Further, by means of specific switching in operation, the memory controller 8 switches the input/output switching circuit 11 and amplifier and filter circuit 12 to an input mode. In this condition, the speaker 13 is used as a microphone which converts voice signals, inputted externally, into electrical analog signals. The electrical analog signals from the microphone 13 pass through the input/output switching circuit 11 after amplification and removal of superfluous frequency signals by the amplifier and filter circuit 12. Then the analog signal from the microphone 13, passed through the input/output switching circuit 11, is coded to digital format in the analog-to-digital converter 7. The digital data is then stored in the memory circuit 9 in a plurality of sequential addresses selected by the memory controller 8. The recorded voice is played back as described above.

The time available for recording and playback is determined by the capacity of the memory circuit 9 and the speed or frequency of inputs and outputs from the memory. For example, when the capacity of the memory circuit 9 is 16K bit and the data is inputted to the memory at a bit rate of 8K bits per second, it is possible to record for only two seconds.

When considering possible usages of this electronic timepiece with a recording function in accordance with the invention, there is a significant difference between the conditions of recording a voice and other recordings such as music. When recording only voice to use as an alarm message reproduced from the electronic timepiece, a tone quality which is made a bit poorer by reducing the bit rate is still usable. This is possible when the voice is readily recognized because it has been recorded by the user himself. On the other hand, when recording other sounds, such as music to use as an alarm sound when actual time coincides with a preselected time, it is desirable to have good tone quality. This can be provided by increasing the bit rate in writing in and reading out data from memory.

Figure 3:
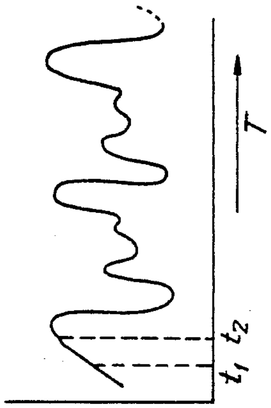
FIG. 3 is a representative waveform of a voice signal.

For instance, when coding a voice signal as shown in FIG. 3, the analog signal is sampled and converted into a digital signal intermittently along the time axis. Thus, the voice signal is converted to digital data, for example at the time $t_1$ and then the voice signal is converted to a digital signal again at the time $t_2$ and so on. Similarly, when reproducing the voice from memory, the voice signal from memory is converted from digital to analog intermittently at corresponding time intervals. Therefore, with a reduction of the time interval between $t_1$ and $t_2$, the reproduced voice waveform approaches the initial waveform and tone quality is good. However, with a reduction of the time interval between $t_1$ and $t_2$, the capacity required in the memory circuit increases if data for a selected elapsed time is to be stored.

However in an electronic timepiece in accordance with the invention, the bit rate is varied to control the time duration of data which is stored in memory. The memory controller 8 of FIG. 1 includes a circuit which switches the bit rate by operation of the external operation switch of the timepiece. That is, a circuit (FIG. 2) is provided wherein the speed of converting analog signals to digital signals or digital signals to analog signals is varied.

Figure 2:
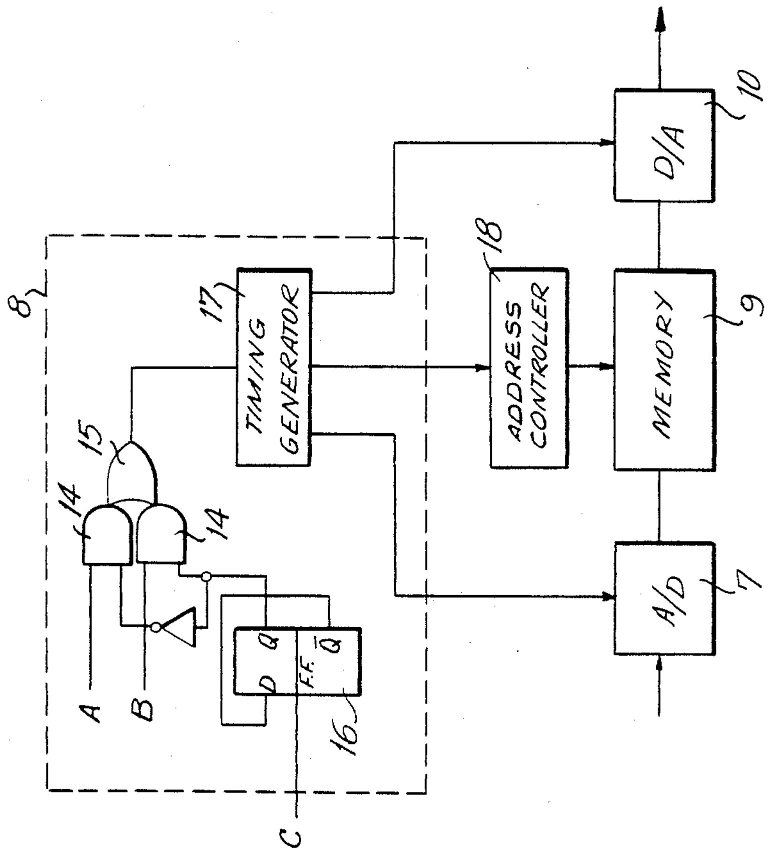
FIG. 2 is a bit rate switching circuit for the circuit of FIG. 1.

The circuit of FIG. 2 includes a D-type flip-flop circuit 16 which receives a control signal at terminal C from the switching controller 6 in response to operation of the external operation member and a portion of the swtiches 20. When a control signal is inputted to terminal C, the output Q of the flip-flop 16 is changed in state. In response to the states of the outputs Q, $\bar{Q}$ either one of the signals at the terminals A and B pass through the selection gate formed of the AND gates 14 and OR gate 15. The flip-flop circuit 16 inverts its outputs to feed the signals of terminals A and B alternately each time the external operation member is operated. For example, when an 8 KHz output signal from the divider 2 is connected to the terminal A, and a 16 KHz output signal from the divider 2 is applied to the terminal B, and the output signal Q of the flip-flop circuit 16 is at the high level, then a 16 KHz signal is applied to a timing generator 17. Then, either the analog-to-digital converter 7 or the digital analog converter 10 operates with a memory address controller 18 in response to the timing signal of 16 KHz. The sound is recorded or reproduced, respectively, with a period of $1/16\times10^3$ seconds, which is the rate of selecting addresses in sequence in the memory 9.

When operating the external operational member from this condition, the output signal Q of the flip-flop 16 changes to become low and an 8 KHz signal is supplied to the timing generator 17 and sound is recorded or reproduced with a period of $\frac{1}{8}\times10^3$ seconds. If the capacity of the memory circuit is 64K bit, it is possible to record or reproduce for eight seconds when using the bit rate of 8K bit per second or four seconds when using the rate of 16K bit per second.

As explained above, with an electronic timepiece in accordance with the invention, when the user records his own voice and uses the recorded voice as a message to himself, it is possible for the user to easily recognize the message because the content of the message can be readily anticipated. Therefore, the message is comprehended even when the timepiece is used with the lowered bit rate. Recording time is thereby lengthened.

Where the person who receives the message is to be other than the person who records the message, then it may be desired to have better tone quality and the higher bit rate is preferably used in recording and playback. In that situation, although the recording time becomes less, the message is recognizable to the user of the timepiece by using the higher bit rate. Further, it is possible to record at one bit rate and reproduce at the other bit rate so that it is possible to have a function of rapid or slow reproduction. Thereby the uses of the electronic timepiece in accordance with this invention are extended. Music can be recorded for playback at either of the high or low bit rates but preferably the higher bit rate with better tone quality is desirable.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. In an electronic timepiece including an oscillator generating a high frequency standard signal, a divider network dividing down said standard signal to lower frequency signals, timekeeping means for accumulating said lower frequency signals as timekeeping data, a display for displaying at least a portion of said timekeeping data, the improvement therein comprising:

memory means for storing digital data therein at a plurality of addresses;

a digital/analog converter for receiving digital data from said memory addresses in sequence and outputting analog signals corresponding to said digital data;

output means for converting said analog signals into audible sound;

memory control means for selecting said memory addresses in said sequence for readout to said digital/analog converter, said memory control means being adapted to select said addresses at at least two rates, said rates being dependent upon signals to said memory control means derived from said divider network;

external control means for inputing signals to said memory control means for selecting a rate for address selection, onestate of said external control means producing a first address selection rate, another state of said external control means producing a second address selection rate, the time for complete reading of said memory addresses being less at the higher address selection rate than at the lower address selection rate;

input means for receiving externally generated audible sounds and generating analog signals corresponding thereto;

an analog/digital converter for receiving said analog signals and outputting digital data corresponding thereto; and switch means for selecting between reading data from said memory addresses or writing data into said memory addresses, said switch means in one state directing said input analog signal to said analog/-digital converter, and in another state directing the output of said digital/analog converter to said output means for converting analog signals into audible sound, said analog/digital converter inputting data to said memory addresses selected by said memory control means at one of said rates of said memory control means for selecting memory addresses, said external control means being adapted to determine the state of said switch means for either input or output.

2. An electronic timepiece as claimed in claim 1, and further comprising an alarm circuit, said external control means being further adapted to select a time for actuating said alarm circuit, said alarm circuit including coincidence means for comparing said selected time and actual time indicated by said timekeeping data and outputting an alarm signal in response to coincidence thereof, said alarm signal being input to and initiating operation of said memory control means, said data stored in said memory means being read, converted and reproduced audibly at a rate determined by the selected state of said external control means, whereby a message prerecorded by the user may serve as an alarm signal.

3. An electronic timepiece as claimed in claim 1, wherein said output means is a loudspeaker.

4. An electronic timepiece as claimed in claim 1, wherein said output means is a loudspeaker and said input means is a microphone.

5. An electronic timepiece as claimed in claim 4, wherein said loudspeaker also serves as said microphone.

6. An electronic timepiece as claimed in claim 1, and further comprising means for amplifying said analog signals generated by said input means and said analog signals input to said output means.

7. An electronic timepiece as claimed in claim 6, and further comprising a filter associated with said amplification means.

8. An electronic timepiece as claimed in claim 1, wherein said memory means is a semi-conductor memory.

9. An electronic timepiece as claimed in claim 4, wherein said memory means is a semi-conductor memory.

10. An electronic timepiece as claimed in claim 6, wherein said memory means is a semi-conductor memory.

11. An electronic timepiece as claimed in claim 1, wherein said external control means is adapted to select the rate for address selection during reading data from said memory addresses and the rate of writing data into said memory addresses.

12. An electronic timepiece as claimed in claim 1, wherein one of the address selection rate is 8K bit/sec.

13. An electronic timepiece as claimed in claim 12, wherein the other of the address selection rates is 16K bit/sec.

14. An electronic timepiece is claimed in claim 1, wherein one of the address selection rates is 16K bit/-sec.

15. An electronic timepiece as claimed in claim 11, wherein one of the address selection rates is 8K bit/sec.

16. An electronic timepiece is claimed in claim 15, wherein the other of the address selecting rates is 16K bit/sec.

17. An electronic timepiece is claimed in claim 11, wherein one of the address selection rates is 16K bit/-sec.

18. In an electronic timepiece including an oscillator generating a high frequency standard signal, a divider network dividing down said standard signal to lower frequency signals, timekeeping means for accumulating said lower frequency signals as timekeeping data, a display for displaying at least a portion of said timekeeping data, the improvement therein comprising:

memory means for storing digital data therein at a plurality of addresses;

a digital/analog converter for receiving digital data from said memory addresses in sequence and outputting analog signals corresponding to said digital data;

output means for converting said analog signals into audible sound;

input means for receiving externally generated audible sounds and generating analog signals corresponding thereto;

an analog/digital converter for receiving said analog signals and outputting digital data corresponding thereto;

switch means for selecting between reading data from said memory addresses or writing data into said memory addresses, said switch means in one state directing said input analog signal to said analog/digital converter, and in another state directing the output of said digital/analog converter to said output means for converting analog signals into audible sound, said analog/digital converter being adapted to input data to said memory addresses at one of at least two rates; and external control means adapted to determine the state of said switch means for selecting either input or output, said external control means being further adapted to select the rate of inputting data to said memory addresses.

19. An electronic timepiece as claimed in claim 1, and further comprising an alarm circuit, said external control means being further adapted to select a time for actuating said alarm circuit, said alarm circuit including coincidence means for comparing said selected time and actual time indicated by said timekeeping data and outputting an alarm signal in response to coincidence thereof, said alarm signal being input to and initiating operation of said memory control means, said data stored in said memory means being read, converted and reproduced audibly at a rate determined by the selected state of said external control means, whereby a prerecorded message may serve as an alarm signal.

20. An electronic timepiece as claimed in claim 19, and further comprising means for amplifying said analog signals generated by said input means and said analog signals input to said output means.

21. An electronic timepiece as claimed in claim 20, and further comprising a filter associated with said amplification means.

22. An electronic timepiece as claimed in claim 19, wherein said memory means is a semi-conductor memory.

23. An electronic timepiece as claimed in claim 18, wherein said rates of inputting data to said memory addresses are dirived from said divider network.

24. An electronic timepiece as claimed in claim 18, and further comprising memory control means for selecting said memory addresses in said sequence for readout to said digital/analog converter, said memory control means being adapted to select said addresses at said at least two rates; said external control means being further adapted to select the rate of address selection.

25. An electronic timepiece as claimed in claim 18, wherein one of the data inputting rates is 8K bit/sec.

26. An electronic timepiece as claimed in claim 25, wherein the other of the data inputting rates is 16K bit/sec.

27. An electronic timepiece as claimed in claim 18, wherein one of the data inputting rates is 16K bit/sec.

28. An electronic timepiece is claimed in claim 24, wherein one of said data inputting rates is 8K bit/sec.

29. An electronic timepiece as claimed in claim 28, wherein the other of the data inputting rates is 16K bit/sec.

30. An electronic timepiece as claimed in claim 24, wherein one of the data inputting rates is 8K bit/sec.

31. An electronic timepiece as claimed in claim 18, wherein said output means is a loudspeaker and said input means in a microphone.

32. An electronic timepiece is claimed in claim 31, wherein said loudspeaker also serves as said microphone.

33. An electronic timepiece as claimed in claim 1, wherein said memory means is a semi-conductor memory.

34. In an electronic timepiece including an oscillator generating a high frequency standard signal, a divider network dividing down said standard signal to lower frequency signals, timekeeping means for accumulating said lower frequency signals as timekeeping data, a display for displaying at least a portion of said timekeeping data, the improvement therein comprising:

memory means for storing digital data therein at a plurality of addresses;

a digital/analog converter for receiving digital data from said memory addresses in sequence and outputting analog signals corresponding to said digital data;

output means for converting said analog signals into audible sound;

memory control means for selecting said memory addesses in said sequence for readout to said digital/analog converter, said memory control means being adapted to select said addresses at at least two rates, said rates being dependent upon signals to said memory control means derived from said divider network;

external control means for inputting signals to said memory control means for selecting a rate for address selection, one state of said external control means producing a first address selection rate, another state of said external control means producing a second address selection rate, the time for complete reading of said memory addresses being less at the higher address selection rate than at the lower address selection rate;

means for amplifying said analog signals input to said output means; and a filter associated with said amplification means for removing superfluous components generated by said digital/analog converter.

35. An electronic timepiece as claimed in claim 34, wherein one of said address selection rates is 8K bit/sec.

36. An electronic timepiece as claimed in claim 35, wherein the other of the address selection rates is 16K bit/sec.

37. An electronic timepiece as claimed in claim 34, wherein one of the address selection rates is 16K bit/sec.

38. An electronic timepiece as claimed in claim 34, wherein the digital data stored in said memory addresses is representative of a verbal message, the clarity of reproduction of said verbal message being dependent on the rate of address selection.

* * * * *